United States Patent [19]

Lehman

[11] 4,238,774
[45] Dec. 9, 1980

[54] DRIVE CIRCUITS FOR A HIGH RESOLUTION CATHODE RAY TUBE DISPLAY

[75] Inventor: Frederick D. Lehman, Rockford, Minn.

[73] Assignee: CPT Corporation, Eden Prairie, Minn.

[21] Appl. No.: 896,813

[22] Filed: Apr. 17, 1978

[51] Int. Cl.³ .............................................. H04N 5/68
[52] U.S. Cl. .................................... 358/242; 358/188; 340/728
[58] Field of Search .................. 358/87, 88, 108, 109, 358/166, 230, 237, 242, 86, 184, 188; 340/728; 315/399, 370

[56] References Cited

U.S. PATENT DOCUMENTS

| | | | |
|---|---|---|---|
| 2,237,651 | 4/1941 | Bruche | 250/27 |
| 2,717,329 | 9/1955 | Jones et al. | 358/242 X |
| 3,176,137 | 3/1965 | Hofmann et al. | 250/99 |
| 3,504,122 | 3/1970 | Ratliff | 358/88 |
| 3,559,085 | 1/1971 | Ishijima | 330/13 |
| 3,662,102 | 5/1972 | Herndon | 178/7.7 |
| 3,750,133 | 7/1973 | Helbig et al. | 340/324 AD |
| 3,878,532 | 4/1975 | Buck | 340/347 AD |
| 3,947,723 | 3/1976 | Thompson | 315/389 |

FOREIGN PATENT DOCUMENTS 1240190 7/1971 United Kingdom .
1486217 9/1977 United Kingdom .
1496900 1/1978 United Kingdom .

OTHER PUBLICATIONS

Proceedings of the Society of Photo-Optical Instrumentation Engineers, vol. 4, May 5, Oct. 1972.

Primary Examiner—Robert L. Richardson
Attorney, Agent, or Firm—Dorsey, Windhorst, Hannaford, Whitney & Halladay

[57] ABSTRACT

A dynamic new circuit is disclosed which permits an extremely high resolution cathode ray tube display. Utilizing this circuit, horizontal drive operating frequency may be increased by a factor of approximately four and video drive operating frequency may be increased by a factor of approximately ten. Improved circuits for horizontal drive, vertical drive, video drive and associated circuitry are disclosed which cooperate to produce a high frequency display which has unparalleled clarity and resolution.

37 Claims, 4 Drawing Figures

DRIVE CIRCUITS FOR A HIGH RESOLUTION CATHODE RAY TUBE DISPLAY

BACKGROUND OF THE INVENTION

This invention relates to display circuits for cathode ray tubes. Because of current circuit designs being utilized, conventional television monitors are operated at a horizontal drive frequency of about fifteen kilocycles. Conventional high speed monitors are operated with a video drive frequency of about twenty megacycles. It has been recognized repeatedly in the past that achievement of higher frequency operation would and could produce improved resolution.

This realization has produced some specific developments such as described in U.S. Pat. No. 3,878,532, which discloses a high frequency analog to digital conversion apparatus, to be used with a cathode ray tube having an apertured target member. Other attempts which have been made to vary the frequency response and thus improve resolution include patents such as U.S. Pat. No. 3,750,133 which teaches a method of rotating the deflection yoke of a cathode ray tube ninety degrees to provide fast vertical rather than fast horizontal sweeps.

While such incremental increases in frequency may provide incremental improvements in resolution, the total interaction of frequency response in the entire display circuitry has not been approached with an integrated design and selected improvements to individual circuit parameters have not produced a substantial improvement in overall resolution of cathode ray tube displays.

SUMMARY OF THE INVENTION

The present invention is a design for the display circuitry for a cathode ray tube which permits the operating frequency of the horizontal drive to be increased by a factor of four and the operating frequency of the video drive to be increased by a factor of ten. Using the circuits disclosed horizontal drive can be operated at a frequency of about fifty kilocycles and video drive can be operated at a frequency of two hundred megacycles. Complementary design changes are also disclosed for vertical drive circuitry.

The high frequency video drive signal is achieved using emitter coupled logic (ECL) coupled with discrete components in a circuit design which yields the high frequency response desired. An ECL differential amplifier driver is used as a high frequency receiver for the raster scan video input signal. The high frequency input signal is then converted to a high speed current signal with two ECL drivers connected in parallel and each connected to a two transistor current mode switch. A high frequency voltage output signal is created with a third transistor connected in a cascode arrangement with one of the transistors in the current mode switch. The output signal is critically damped and diode clamped to protect the output transistor. Means are also provided for dissipating power created within the circuit.

The high frequency horizontal drive circuit also uses high speed components to create a two-way scan circuit. Two transistors are connected to the horizontal yoke of the tube to cause sweep and retrace to occur. During normal operation the sweep transistor is on. Timing components are provided to receive, time and control the duration of retrace after receipt of a retrace sync pulse. First timing means establish a first timing interval. The first timing means are connected to an electronic switching circuit which controls the sweep transistor and turns it off during retrace.

The retrace sync pulse also turns the retrace transistor on causing a retrace scan to occur. This is accomplished with a second circuit means having a retrace timer which generates a time interval for retrace which is smaller in duration than the time interval during which the sweep transistor is off and which is initiated a finite time after the first time interval and terminated prior to the termination of the first time interval. An electronic switching circuit is also connected to the retrace timer to control the retrace transistor.

Voltage generated by the horizontal drive circuit is also used with a voltage multiplier to provide a 1.1 kilovolt acceleration potential for the first anode of the tube. Voltage generated, with appropriate controls, is also used as a variable voltage supply to the brightness grid of the tube.

The vertical drive circuit disclosed also utilizes solid state design. A voltage ramp generator is utilized for the vertical trace wave form with a solid state shaping circuit for compensating for nonlinearities due to the surface of the tube. The shaped wave form and the voltage ramp are connected to the summing node of an operational amplifier to produce the output signal for the vertical yoke. Circuitry is also disclosed for vertical retrace which is an integral part of the vertical drive circuit. A zero crossover network is also disclosed as well as a dynamic focus circuit which is connected from the vertical drive circuit to the focus grid of the tube because the vertical axis is the long axis in a preferred embodiment of the invention.

Protection circuitry is also disclosed which removes the signal from the brightness grid if loss of horizontal or vertical signal is detected.

DESCRIPTION OF THE PREFERRED EMBODIMENT

Extremely high operating frequencies are achieved utilizing emitter coupled logic (ECL) in an integrated design with high speed solid state components. This permits operation of the video drive circuitry at approximately two hundred megacycles and produces pulse rise and fall times in that circuitry in the range of two to five nanoseconds. Similarly, the horizontal drive circuitry disclosed utilizes high speed components in a two way scan design that permits operation of the horizontal drive circuitry at a frequency of fifty kilocycles. While improvements are disclosed to each of the circuits shown, the preferred embodiment utilizes, in combination, all improvements to create a high resolution display.

Instead of a conventional MOS character generator, the input to the video drive disclosed requires a higher speed character generator (not shown). High speed PROMs, manufacturers designation 74S741, could be utilized. Specially manufactured high speed TTTL ROMS sufficient to generate a seven by nine dot matrix have also been found satisfactory. The output of the high speed character generator should be converted with an ECL shift register (not shown) to a raster scan video input signal of the desired operating frequency.

The circuits described in detail below are preferably utilized with a high resolution tube. The circuit designs shown and described can be satisfactorily utilized with a high resolution, one hundred ten degree, fifteen inch tube manufactured by Clinton Electronics in Chicago, Illinois.

VIDEO DRIVE CIRCUITRY

Figure 1A:
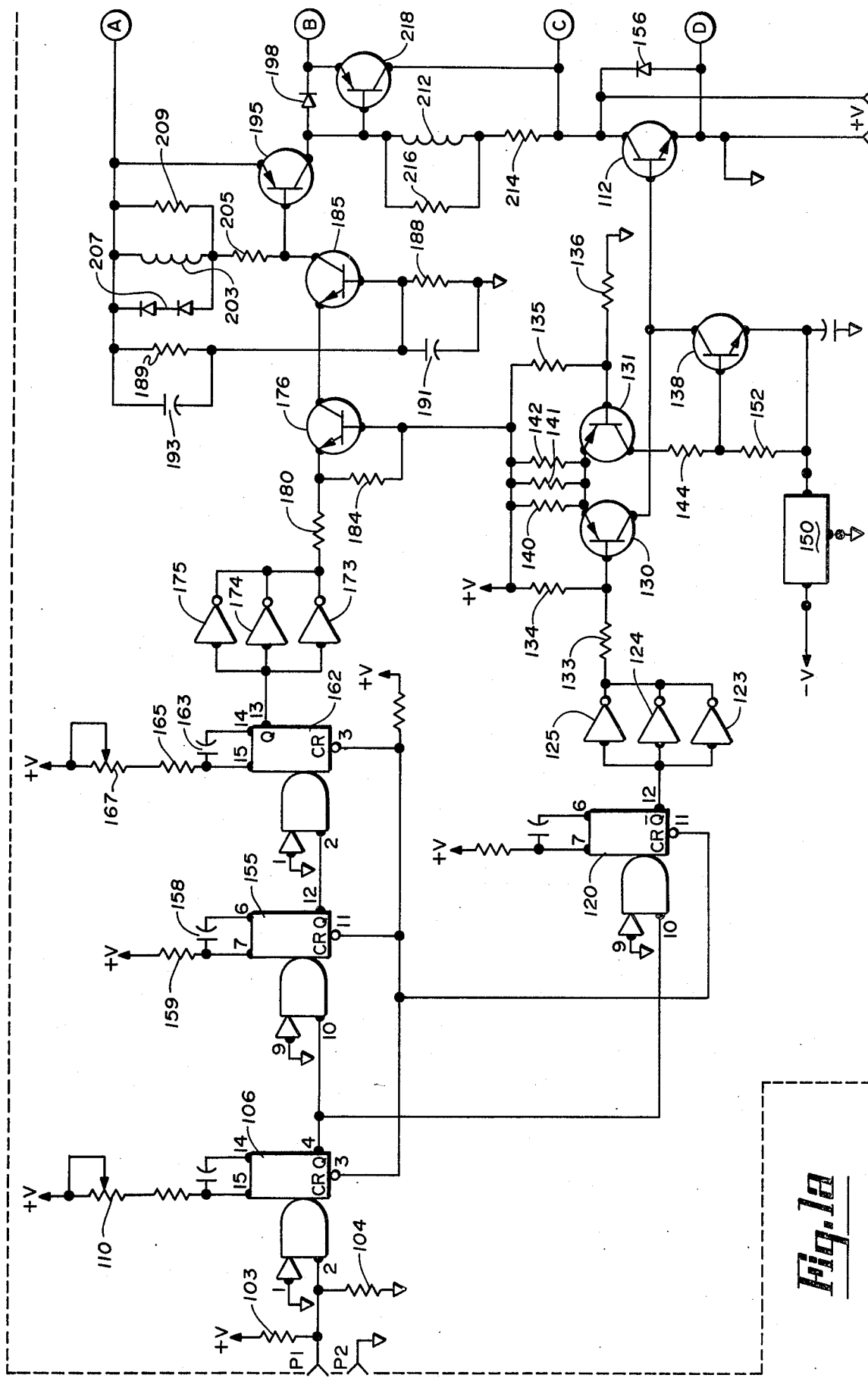
FIG. 1, comprising FIGS. 1a through 1d, discloses in schematic diagram form a preferred embodiment of the invention. As shown in the drawing, the invention comprises horizontal drive circuitry shown primarily in FIGS. 1a and 1b, vertical drive circuitry shown primarily in FIGS. 1c and 1d, and video drive circuitry shown in FIG. 1d.
Figure 1B:
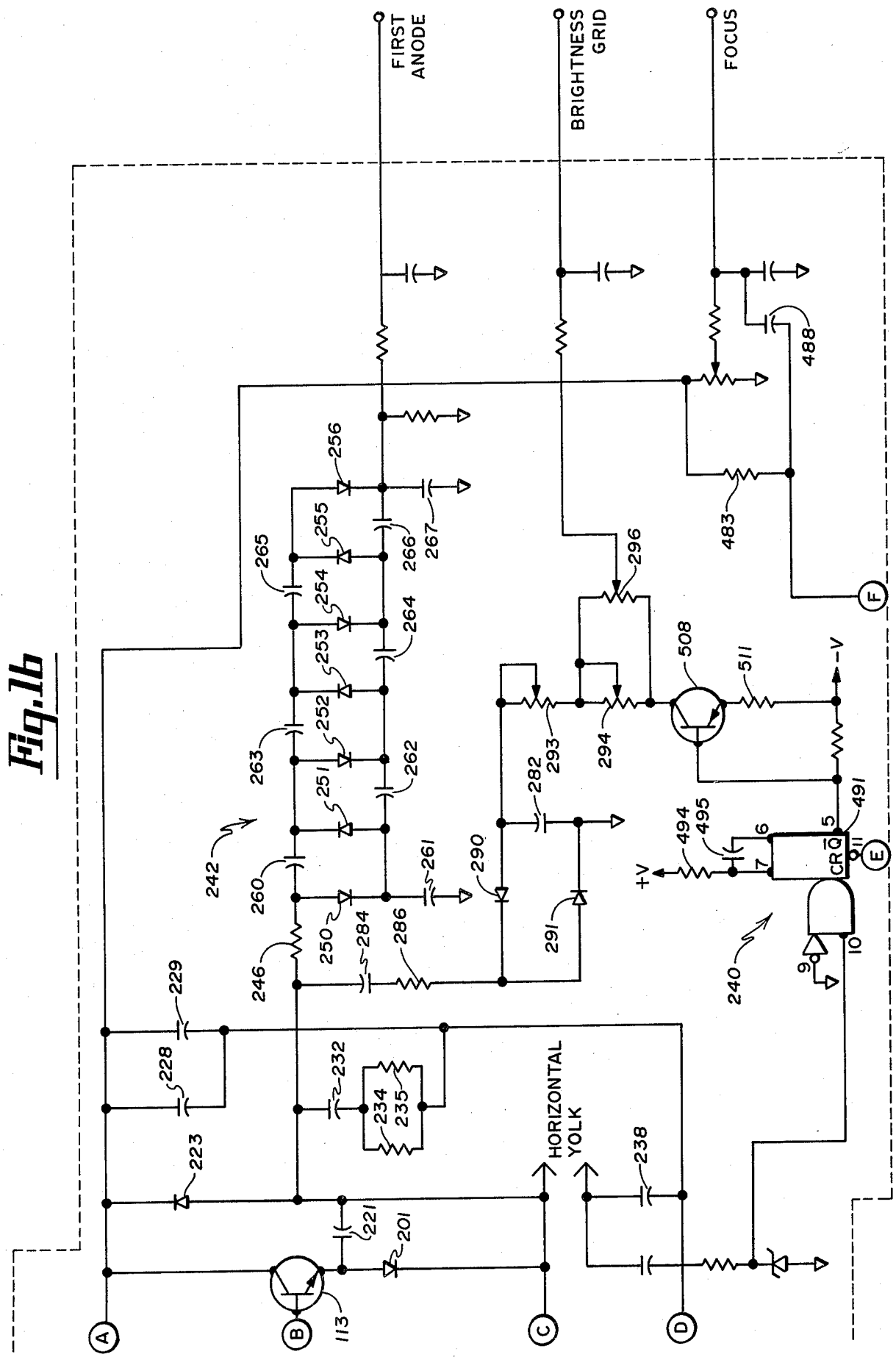
Figure 1C:
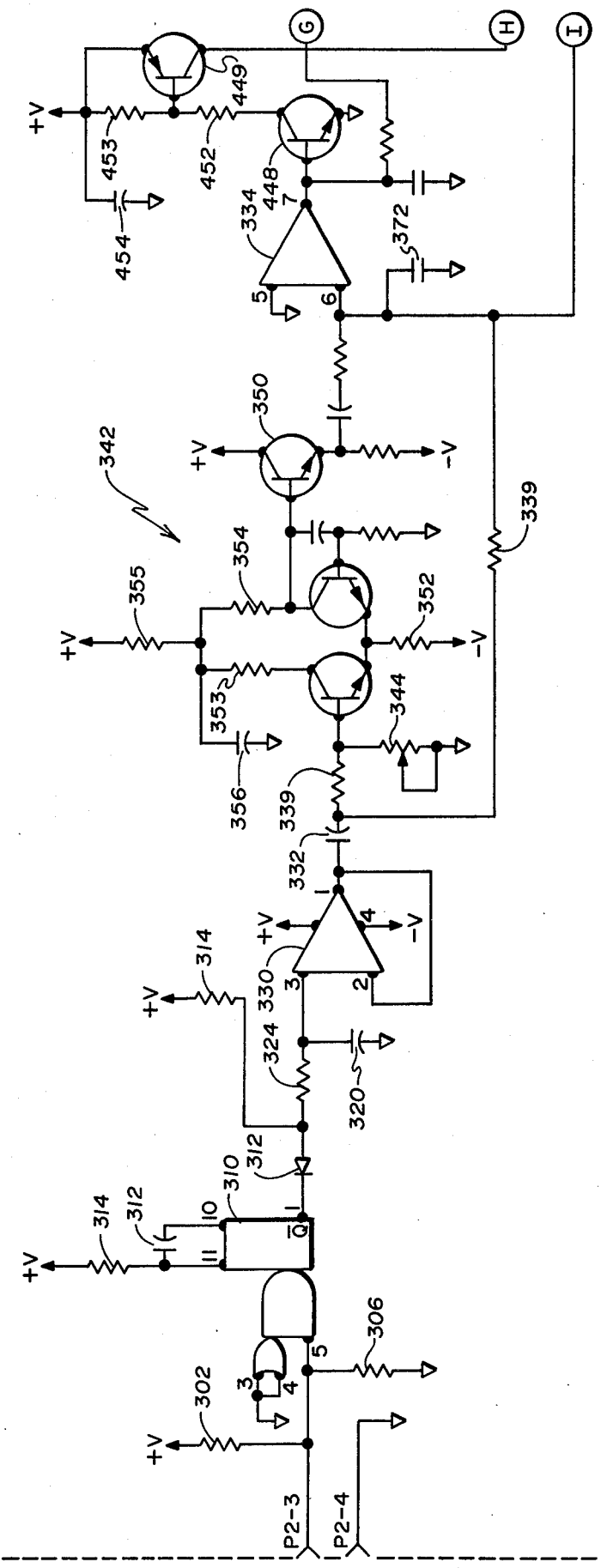
Figure 1D:
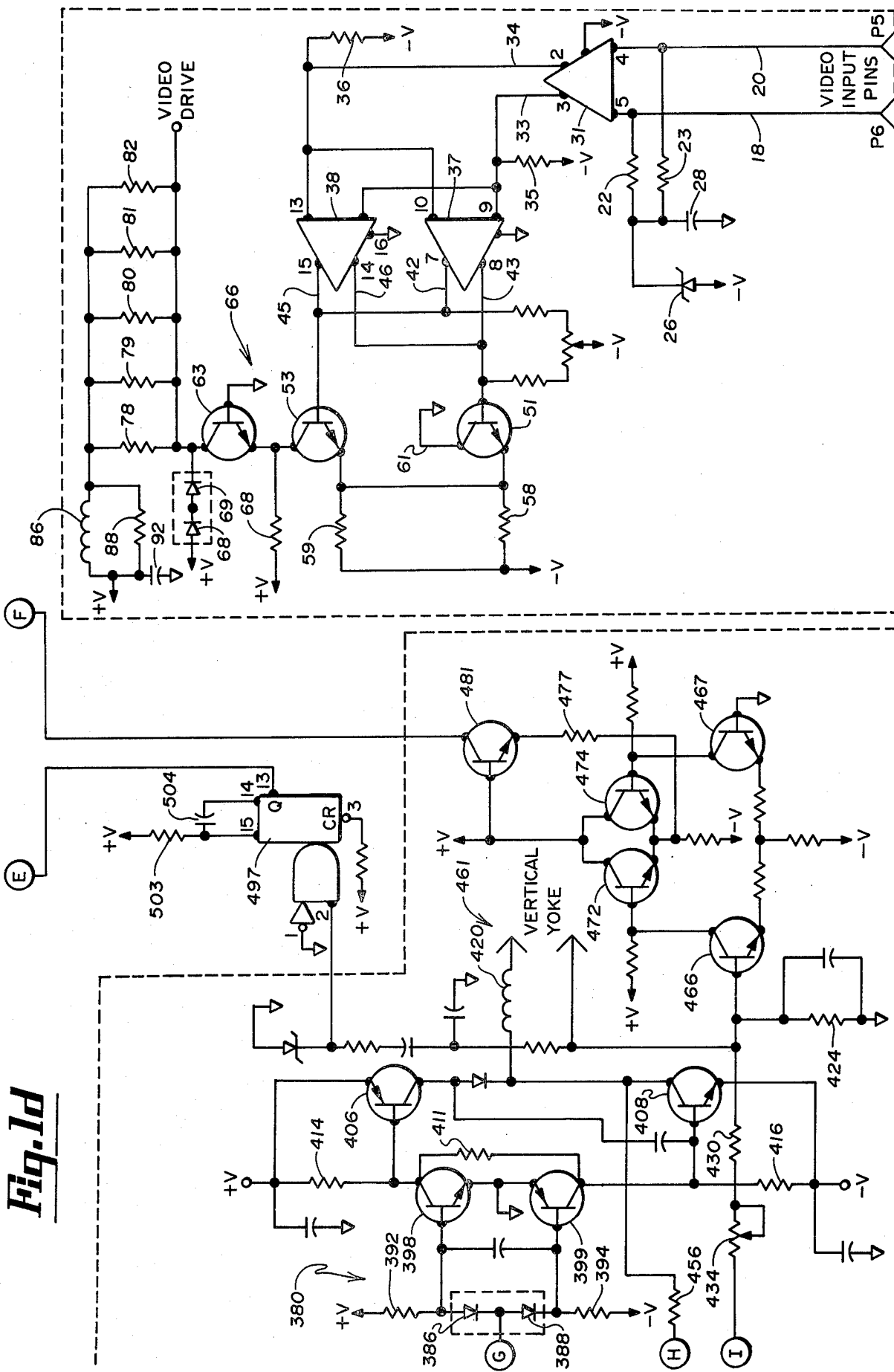

As shown in FIG. 1d, video input from the ECL shift register is applied to video input pins 5 and 6. Each input line 18, 20 is terminated with a resistor 22, 23 to a negative voltage source generated with a zener diode 26, having a small bypass capacitor 28 to ground. The resistance is chosen to match the impedance of the wires leading to the input as is conventional in high speed logic circuits to eliminate reflections in the line.

The input lines 18, 20 are connected to an ECL amplifier 31, operating as a receiver, for common mode rejection of any noise or reflections which the terminating resistors 22, 23 do not shunt out. The outputs 33, 34 of the ECL amplifier 31 are terminated by resistors 35, 36 and connected to a pair of ECL differential drivers 37, 38 connected in parallel. Two drivers 37, 38 are used to achieve sufficient current for operation of the circuit and to achieve higher speed of operation of the circuit.

The outputs 42, 43 and 45, 46 of the differential drivers 37, 38 are connected to two transistors 51, 53 connected as a differential amplifier to form a non-saturating high speed current mode switch. The transistors 51 and 53 are selected to have a high band width at the operating current level. The emitters of the transistors 51, 53 are connected together and connected through two resistors 58, 59 to voltage source to form a current source. The collector 61 of one 51 of the two transistors 51, 53 forming the differential amplifier is connected to ground. The second transistor 53 is connected in a cascode arrangement to a transistor 63 to form a single ended voltage drive to provide a relatively low operating voltage for the first transistor 53 and a relatively high operating current which is converted to high variable voltage by the other transistor 63.

In the collector-emitter circuit 66 between the transistors 53, 63 a resistor 68 is provided connected to a positive bias that guarantees that when the first transistor 53 is off that the second transistor 63 is reverse biased so that there will be no leakage. Two high voltage, fast recovery clamp diodes 68, 69 are connected to the collector of the transistor 63 to keep the transistor 63 out of saturation. The diodes 68, 69, which preferably have a recovery time in the neighborhood of one to three nanoseconds, are capable of withstanding voltages in the neighborhood of forty volts and can handle surge currents up to two hundred milliamps. A commercially available diode clamp of this type is manufactured by Motorola under Part No. MSD 7000.

To obtain sufficient power to operate the video beam at the desired high frequencies, the output of transistor 63, from the collector, is connected to a regulated voltage source by a high power low resistance bank of resistors 78-82. It is important that these resistors be high power carbon composition resistors rather than wire wound to negate effects of inductance and capacitance.

A small inductor 86 is also provided to compensate for residual capacitance in the video drive, including capacitance attributable to the tube and other circuit parameters including the transistor 63 and diodes 68, 69. A resistor 88 is provided across the inductor 86 to damp any oscillations caused by interaction between the inductor 86 and capacitance of the circuit and the network is grounded through a capacitor 92 to provide a tuned circuit which is critically damped and diode clamped so that the video drive signal is sufficiently attenuated to prevent overshoot during operation.

HORIZONTAL DRIVE CIRCUITRY

To operate at the desired high frequency the horizontal drive is not operated with the conventional flyback technique. Instead, the trace is driven in both directions. Also, rather than using a tuned oscillator which is conventional in raster displays, an inherently linear circuit has been devised which eliminates the correction devices common to conventional displays.

The horizontal drive circuit, which in its normal state is in the sweep mode, responds to a horizontal sync pulse for retrace which is applied to pin 1. Pin 2 is connected to ground. As in the video circuit a pair of terminating resistors 103, 104 is connected to the input. The pulse is applied a short period of time before retrace is desired, the time interval being in the neighborhood of one to two microseconds. The pulse is applied to a one-shot timer 106 which can be adjusted with a potentiometer 110 to provide precise timing for the operation of the circuit. The one-shot preferably has a nominal value of one-half microsecond which can be varied over a range of five to one with the use of a potentiometer 110 to compensate for the various storage times or delays of the circuit components. The output, when the one-shot times out, from pin 4 is connected through various components described more fully below to transistor 112 to control the sweep trace and is also connected to transistor 113 to control the retrace.

To turn the sweep transistor 112 off to allow retrace to occur the output of the timer 106 from pin 4 is connected to pin 10 of a retrace one-shot timer 120 having a nominal time period of eight to twelve microseconds. The time period should be sufficient to allow retrace to occur. The output from the retrace timer 120, pin 12, is inverted by three inverters 123-125 in parallel. The inverters 123-125 are of the open collector type to interface between the TTL logic and discrete components. The output of the inverters 123-125 is connected to two transistors 130, 131 connected as a differential amplifier which operates as a differential switch. The differential switch operates to, in one state, turn the sweep transistor 112 on, and in the other state, to turn the sweep transistor 112 off.

To operate properly, the sweep transistor 112 must be driven on hard and driven off hard. Consequently, the output of the three inverters 123-125 is connected to a voltage divider made up of two resistors 133, 134. The output, from the middle of the voltage divider 133, 134, is applied to transistor 130 which is one side of the differential switch. The voltage applied to the second transistor 131 of the differential switch obtained from the voltage divider formed from resistors 135, 136, is higher than the voltage applied to transistor 131 but is less than full potential so that a transistor 138 controlled by transistor 131 and directly connected to the base of the sweep transistor 112, can be driven on in the opposite state. Connected to the emitters of transistors 130, 131 are three bias resistors 140-142 in parallel, although one properly selected resistor could be used if available.

Transistor 138 is provided to aid in deenergizing the sweep transistor 112. The base of transistor 138 is connected to the output of transistor 131 by resistor 144 and when it is driven into saturation by transistor 131 it guarantees that the sweep transistor 112 will be turned off. It is connected to a negative voltage supplied by a conventional regulator 150 to avoid uneven turn-off time or ripple in the voltage. Consequently, during retrace, the first transistor 130 of the differential switch is off and current flows through 131 from the negative power supply through resistor 152 and the base emitter junction of 138. The collector of 138 is directly connected to the base of sweep transistor 112. Therefore, the negative pulse on the base of 112 turns the sweep transistor off and assures that there is no leakage during the entire retrace cycle. The direct coupling of the collector of transistor 138 to the base of the sweep transistor 112 produces a turn-off time of under one hundred nanoseconds.

A high speed diode 156 is connected across the sweep transistor to protect it by bypassing excess energy from the yoke.

After about nine microseconds, at which time the timer 120 times out and returns to its normal state, the low output of the timer 120, which is connected through the drivers 123-125 turns transistor 130 on and transistor 131 off thereby turning transistor 138 off and transistor 112 on to cause another sweep trace.

This condition continues during the sweep trace and remains until another horizontal sync signal is received to cause another retrace sweep.

The same pulse that turns the sweep transistor 112 off is utilized to turn the retrace transistor 113 on to cause retrace. However, it is important that the sweep transistor 112 be fully off before the retrace transistor 113 is turned on since there is virtually no impedance between them. To achieve the time delay, a timer 155 is utilized to create a nominal delay of approximately one to three microseconds. The nominal time delay is achieved with components 158, 159 which can be varied to give sufficient timing.

After the nominal time delay the $\overline{Q}$ output from pin 12 is connected to a third timer 162 to produce an adjustable turn-on pulse with a nominal width of approximately two microseconds. Timing components 163, 165 and variable resistor 167 are provided to adjust the turn-on pulse within a range of three to one. The function of the timer 162 is to control the duration of the retrace pulse. It can also function to compensate for anomalies in previous circuit elements.

The output of timer 162 is also connected to three inverters 171-173 to interface the TTL logic levels with discrete logic levels for transistor operation. Three inverters 171-173 are used to produce higher current for a transistor 176 which operates as a current switch. When the retrace pulse occurs a voltage is produced across resistor 180 which produces a current through it which is run through common base transistors 176 and 182 which are selected for their high voltage, medium power characteristics. The two transistors 176 and 182 are connected in series in a cascode arrangement to convert the current to voltage. The base of transistor 176 is connected directly to a positive power supply which determines the current through resistor 180.

Resistor 184 is connected between the base and emitter of transistor 176 to guarantee that the transistor 176 has no leakage when it is in its off state. Any leakage current which occurs is shunted through resistor 184 to the base of transistor 176 where it is dissipated.

The base of transistor 185 is maintained at half the horizontal yoke retrace voltage by resistors 188, 189. Capacitors 191 and 193 are connected across a voltage divider made up of resistors 188 and 189 to bypass any noise. The collector of transistor 182 is connected to the base of transistor 195 to turn transistor 195 on for the entire retrace pulse. The collector of transistor 195 is connected through diode 198, a DC blocking diode in the off state, to transistor 113, the retrace transistor, which is then turned on and supplies the horizontal yoke with energy through diode 201 connected to the emitter of the retrace transistor 113.

During the entire retrace sweep inductor 203 is charged through resistor 205. After the retrace network shuts off, detected at transistor 185, the inductor 203 has sufficient energy to apply a negative pulse to the base of transistor 195 to guarantee that the transistor 195 has good turn-off characteristics. That circuit is clamped by diode 207 to assure that the negative pulse from the inductor 203 does not put a reverse bias on the base of the transistor 195 which would damage it. A damping resistor 209 is also connected across the inductor 203 to keep the circuit from ringing due to parasitic capacitance in the inductor 203.

An inductor 212 is provided which is connected to the base of the retrace transistor 113 which is the power-driver transistor for the horizontal yoke. The inductor is charged through resistor 214 and is damped by resistor 216. The output of the inductor 212 is amplified by transistor 218 to turn the retrace transistor 113 off quickly.

Capacitor 221 connected to the emitter of the retrace transistor 113 and across diode 201 assures negative bias of the transistor 113 to prevent leakage current. In the sweep mode it keeps the emitter of transistor 113 at a higher potential than the quiescent point of the base. Capacitor 221 is selected for its high speed characteristics.

Also connected to the yoke drive is diode 223 which protects transistor 113 from reverse bias and shunts energy into capacitors 228 and 229 during the first half of the retrace period. In the absence of such a diode 223 the voltage on the yoke would go sufficiently high to burn out the transistor 113. The diode 223 is selected for its high voltage, high speed characteristics and is an extremely fast recovery diode. Diode 156 connected across the sweep transistor 112 is the equivalent of diode 223 and similarly protects the bottom driver 112 by bypassing excess retrace energy during the first half of trace.

The two capacitors 228 and 229 are expecially selected to provide electrical characteristics suitable for the circuit. Capacitor 228 is preferably a low capacitance non-polar mylar or polystyrene capacitor designed to take high current for a very short period of time to handle the switching edge or load. However, it does not have sufficient capacity to provide sufficiently low ripple so capacitor 229 is connected across capacitor 228 which is a high capacitance aluminum electrolytic capacitor to handle the drive current which itself could not be used alone because it does not have satisfactory high frequency characteristics.

Also connected to the horizontal yoke is a damper consisting of capacitor 232 and resistors 234 and 235 which are connected to ground. These components 232, 234, 235 comprise a yoke damping circuit sufficient to damp extremely high frequency oscillations, in the range of one megahertz, which may occur. The components 232, 234 and 235 must be selected according to the inductive characteristics of the yoke utilized with the circuit and the capacitor 232 selected should have a negative temperature coefficient to provide stable operation at increasing currents. In addition, the resistors 234, 235 should be carbon composition to avoid inductance and must provide sufficient power dissipation for the circuit.

To assure linearity, the yoke is preferably not connected from the trace and retrace transistors 112, 113 to ground but is connected from the switching pair 112, 113 to a shaping circuit comprised of a high frequency polystyrene or Mylar capacitor 238 picked in value to match the inductance of the yoke.

The horizontal drive circuitry is also connected to protection circuitry 240 as discussed more fully below.

Rather than dissipating all of the energy accumulated by the inductance of the yoke it is utilized to provide a well regulated high voltage power supply for the first anode. This is accomplished through a high voltage multiplier 242 consisting of resistor 246 which is connected to a capacitive diode multiplier of the typical cascade type which consists of diodes 250 through 256 and capacitors 260 through 267. The diodes 250–256 must be of a high recovery type and the capacitors 260–267 must be high frequency with a high voltage rating and should be as large as physically feasible. Preferably the high voltage multiplier 242 is designed to provide 1.1 kilovolt for the first anode.

The energy from the yoke drive is also utilized to provide a negative voltage to the brightness grid. This voltage is supplied to capacitor 282 through capacitor 284 and resistor 286 and is maintained with diodes 290 and 291. The actual voltage supplied to the brightness grid is highly adjustable through the use of adjustable resistors 293, 294 and 296.

VERTICAL DRIVE CIRCUITRY

As discussed in detail below, the vertical drive circuit utilizes semiconductor design for all functions including shaping which permits direct coupling of components.

The vertical retrace pulse is applied to the vertical drive circuit shown in FIGS. 1c and 1d at input pins 3 and 4. The vertical retrace pulse is a positive going pulse of short duration. Pin 4 provides the ground return. As in the case of the horizontal drive circuit, a TTL signal is provided, which is terminated by resistors 302 and 306. The input is connected to a one-shot timer 310 which functions to provide a precise retrace pulse regardless of the input pulse received. The timer 310 triggers on the positive edge of the pulse and employs an internal Schmitt trigger for noise rejection. The timing of the timer 310 is nominally set for one hundred microseconds with components 312 and 314. The timing period must be sufficient to discharge the vertical sweep capacitor 320 which should be selected for its dielectric absorption. The output of the timer 310 is connected to a diode 312 to interface with the sweep generator, the output of which is connected to a current source consisting of resistor 314 connected to the positive voltage supply.

When pin 1 of the timer 310 is in the low state, the diode 312 conducts and discharges the capacitor 320. When the timer 310 is in the normal state and the circuit is not retracing, pin 1, the $\bar{Q}$ output of timer 310 is high and the diode 312 is cut off which produces no appreciable effect on the current ramp or voltage ramp produced by the circuit. The resistor 324 is provided to limit the surge current into the capacitor 320 during the retrace pulse from the timer 310.

The foregoing circuitry will produce a linear ramp at the capacitor 320 which is linear up to the desired voltage. Its repetition rate is at the frequency of operation which is sixty hertz in the United States and about fifty hertz in Europe. The linear ramp is supplied to an operational amplifier 330 which functions as an impedance buffer having a low output impedance. The output of the operational amplifier 330 is connected through a DC blocking capacitor 332, to the summing node input, pin 6, of a second operational amplifier 334 through resistor 338 and through resistor 339 to a linearity correction or shaping circuitry 342.

The gain or amplitude of the shaping circuit 342 is governed by variable resistor 344.

The shaping circuit which consists of transistors 347 and 348 and associated components 352–356 produces the shaping function due to the exponential characteristics of the collector current versus base emitter resistance of the transistors 347, 348. Symetric operation is assured by the differential arrangement of parts. The differential transistors 347, 348 and transistor 350 are preferably chosen in a quad pack rather than utilizing matched transistors or matched pairs. Transistor 350 is used for impedance matching of the operational amplifier 334.

The output of the shaping circuit 342 is connected to the operational amplifier 334 at 08n 6, the output of which, from pin 7, is used to drive the vertical yoke. Pin 5 of the summing amplifier 334 is grounded while pin 6 is bypassed with a capacitor 372 to ground to critically damp the circuit. The output from the amplifier 334, on pin 7, functions during the vertical sweep trace to drive a variable current source 380, shown in FIG. 1d.

The current source is made up of a pair of matched diodes, 386, 388, each connected to regulated voltages by resistors 392, 394. The output from each diode 386, 388 is connected to the base of a pair of transistor 398 and 394, respectively, creating an inverted output on the collectors of the transistors.

When the output of the operational amplifier 334, pin 7, goes positive the base of transistor 398 goes slightly positive increasing the current through the transistor 398. At the same time, the base of the second transistor 399 goes positive decreasing the current through the second transistor 399 creating an amplified analog output. This design is utilized so that the transistors 398, 399 do not switch states which prevents zero crossover.

The collector outputs of the transistors 398 and 399 are connected to power transistors 406 and 408 which drive the vertical yoke. Resistor 411 is connected across the collectors of transistors 398 and 399 to assure satisfactory quiescent current of transistors 406 and 408 and resistors 414 and 416 are also provided to shunt current across the base emitter circuit of transistors 406 and 408 to improve the quiescent performance of the transistors.

The output from the collectors of transistor 406 and 408 is connected to the yoke through an inductor 420 which is designed to decouple noise picked up by the vertical yoke from the horizontal drive signal. The return from the yoke is connected through a power resistor 424 to ground. The voltage signal present on the ungrounded side of resistor 424, representing the current going through the vertical yoke is connected back to the summing node, pin 6, of the operational amplifier 334 through resistors 430 and 434 closing the loop. In this manner gain is increased automatically when the yoke current and temperature increase creating a larger voltage to drive the yoke to assure that current through the yoke remains essentially constant.

The linear amplifier circuitry previously discussed drives the yoke during normal sweeping, that is, from the top of the screen down to the bottom. An additional circuit is provided consisting of transistors 448 and 449 and associated components 452, 453 and 454, also controlled by operational amplifier 334 to return the beam to the top of the screen. It is supplied from the energy source supplying the video drive since the video drive is always off during vertical retrace in normal operation.

The retrace signal to the base of transistor 448 is produced when, at the bottom of the sweep, the sweep capacitor 320 has discharged. The operational amplifier 334 has positive drive on both ends of the current source into pin 6 so the summing node is highly negative. Consequently the output, on pin 7, goes positive until transistor 448 clamps the voltage. Since the output is directly coupled to transistor 448, the transistor 448 is driven into saturation. Transistor 448 is connected to the base of transistor 449 by resistor 452. This produces a sufficient signal to saturate transistor 449. When transistor 449 is in saturation sufficient energy to accomplish retrace is provided to the yoke through resistor 456.

Resistor 453 is provided to keep transistor 449 in the off state during the vertical sweep and capacitor 454 is connected across resistor 453 to bypass noise which may be generated from the video circuit.

A dynamic focus circuit 461 is also provided which is connected to the yoke. The yoke current is connected to pass through a differential amplifier made up of transistors 466 and 467. The differential current is amplified and rectified by transistors 472 and 474 producing a variable current through resistor 477 which is proportional to the absolute value of the vertical position of the trace from center. In other words, a high current from the yoke is produced when the trace is at the center, and low current is produced at the top and bottom of the trace. Voltage is applied to transistor 481 from the voltage source through resistor 483 to the collector of the transistor. The output, from the dynamic focus circuit 461, is connected to the base of transistor 481 which produces a sawtooth trace varying between substantially zero volts when the trace is in the center vertically and higher voltages when the trace is at the top and bottom of the screen with a linear ramp in between. The signal is coupled through capacitor 488 to the focus grid of the tube as a focus correction to the standard focus required by the screen. The focus correction is required because of the longer path that the electron beam must follow when it is at the edges of the screen. Since the vertical axis is the long axis for the preferred embodiment of the display this focus correction is adequate when applied to only the long axis.

PROTECTION CIRCUITRY

Protection circuitry 240 is also provided to remove the signal from the brightness grid. This will occur any time that a horizontal sync signal or vertical sync signal is lost for any reason. Elimination of the brightness signal will prevent burning or otherwise damaging the screen. The protection circuitry utilizes a dual retriggerable one-shot timer 491, which is connected to the signal from the horizontal yoke. The timer is set for a nominal timing of fifty microseconds with the use of components 494 and 495 and under normal operation will be triggered every twenty microseconds.

The protection circuitry 240 is also connected to the vertical drive at input pin 2 of a second retriggerable timer 497 which is designed to time out at approximately fifty milliseconds with components 503 and 504. Vertical retrace should occur every sixteen to twenty milliseconds depending on use in the United States or in Europe. If a vertical retrace pulse is not received, timer 497 times out and the Q output on pin 13 is connected to the clear input of timer 491. Consequently, if a vertical retrace sync is not received, the timer 491 will be cleared and the video will be shut down. Shut down is accomplished with the utilization of a switchable current source through transistor 508. The current source is produced by a fixed voltage across resistor 511 producing voltages on resistors 293, 294 and 296 which are connected directly to the brightness terminal of the display.

In general, while a specific embodiment of the invention has been described, it is to be understood that this is for the purpose of illustration only and that various modifications can be made within the scope of the invention and that all such modifications are within the intendment of the invention.

I claim as my invention:

1. An electronic circuit for producing a high resolution cathode ray tube display comprising:
    a video drive circuit comprising means for converting a high frequency digital raster scan video input signal into a high voltage high frequency video drive signal at a bit data rate in excess of one hundred fifty megacycles; and
    a horizontal drive circuit comprising means for generating a two-way horizontal drive signal which operates at a frequency in excess of forty kilocycles.

2. The electronic circuit of claim 1 further comprising a vertical drive circuit for generating a vertical drive output signal comprising solid state signal shaping means for generating an output signal for the vertical trace scan which is compensated for nonlinearities due to the surface of the tube and a solid state vertical retrace circuit for generating a vertical retrace scan signal after the vertical scan has been completed.

3. A video drive circuit for producing a high resolution cathode ray tube display from a high frequency low voltage logic level video input signal comprising:
    receiving means for receiving the video input signal; and
    conversion means connected to the receiving means for generating a high frequency high voltage video drive signal from the low voltage logic level input signal, the video drive signal having a data rate frequency in excess of sixty megacycles.

4. The video drive circuit of claim 3 wherein the receiving means and the conversion means have a response time of less than 5 nanoseconds.

5. The video drive circuit of claim 3 wherein the receiving means and conversion means comprise emitter coupled logic.

6. The video drive circuit of claim 3 wherein said conversion means operates at a frequency of 100 megacycles.

7. The video drive circuit of claim 3 wherein said conversion means operates at a frequency of approximately 200 megacycles.

8. The video drive circuit of claim 3 wherein the conversion means comprises:
  current conversion means for converting the high frequency input signal to a high frequency current signal; and
  voltage conversion means for converting the high frequency current signal to a high frequency voltage signal.

9. The video drive circuit of claim 8 wherein the current conversion means comprises two differential amplifiers connected in parallel to produce higher current, each of which is connected to a different transistor, the two transistors being connected to form a high frequency current mode switch.

10. The video drive circuit of claim 9 wherein the display circuit further comprises a source of voltage and wherein the voltage conversion means comprises a third transistor connected in a cascode arrangement between one of the two transistors in the current conversion means and the source of voltage.

11. The video drive circuit of claim 10 further comprising damping means connected between the source of voltage and the video drive input of the cathode ray tube whereby the circuit is critically damped.

12. The video drive circuit of claim 11 further comprising at least one diode connected between the third transistor and the video drive input of the cathode ray tube whereby the circuit is diode clamped.

13. The video drive circuit of claim 3 further comprising means for dissipating power generated by operation of the circuit.

14. A video drive circuit for producing a high resolution cathode ray tube display from a high frequency video input signal comprising:
  a receiver having two outputs for receiving the high frequency input signal;
  two drivers each having two outputs connected in parallel, each driver connected to the two outputs of the receiver;
  a high current differential switch comprising two transistors, each of which is connected to each of the outputs of the two drivers;
  a third transistor connected to one of the two transistors in the differential switch in a cascode arrangement;
  a voltage source connected to the third transistor for supplying a high frequency output signal to the video drive input terminal of the cathode ray tube;
  diode means connected to the third transistor for diode clamping the signal from the circuit;
  means for critically damping the output signal; and
  means for dissipating power produced by the circuit.

15. A video drive circuit for producing a high resolution cathode ray tube display from a high frequency video input signal comprising;
  a differential amplifier connected to the input signal to receive the high frequency video input signal;
  two differential amplifier drivers connected in parallel to the outputs of the first differential amplifier;
  two transistors connected in parallel to the outputs of the drivers to form a differential high current switch;
  a third transistor connected in series in a cascode arrangement to one of the two transistors forming the differential high current switch;
  a voltage source controlled by the third transistor and connected to the video input terminal of the tube; and
  means for dissipating power generated by operation of the display.

16. An electronic cathode ray tube display circuit to be connected to a cathode ray tube having a video input terminal, a horizontal yoke input terminal and a vertical yoke input terminal comprising
  a high frequency video drive circuit connected to a high frequency low voltage logic video input signal and connected to the cathode ray tube video input terminal capable of generating a video drive signal to turn the electron beam of the cathode ray tube on and off at a data rate frequency in excess of forty megahertz; and
  a high frequency two way scan horizontal drive circuit connected to the horizontal yoke input terminal of the cathode ray tube to cause trace and retrace scans to occur on the cathode ray tube capable of generating a horizontal scan frequency in excess of forty kilocycles to produce a horizontal scan rate of over forty thousand lines per second.

17. The electronic cathode ray tube display circuit of claim 16 wherein the high frequency two-way scan circuit comprises:
  sweep means connected to the yoke of the cathode ray tube for causing the trace to sweep from a first side of the tube to the other;
  receiving means for receiving a retrace sync signal;
  first circuit means connected to the sweep means for turning the sweep means off during retrace comprising:
    first timing means connected to the receiving means for generating a first timing interval during which the sweep means will be off;
    electronic switching means connected to the first timing means and the sweep means for switching the sweep means off during the first timing interval and on after the timing interval established by the first timing means;
  retrace means connected to the yoke of the tube for causing the trace to return to the first side of the tube; and
  second circuit means connected to the retrace means for turning the retrace means on comprising:
    second timing means connected to the receiving means for generating a second time interval smaller in duration than the first time interval and which is initiated a finite time after the first time interval and which terminates prior to the termination of the first time interval; and
    a second electronic switching circuit connected to the second timing means and the retrace means for switching the retrace means on during the second timing interval and off after the second timing interval.

18. The circuit of claim 17 wherein the first timing interval is less than 10 microseconds.

19. The circuit of claim 17 wherein the second timing interval is on the order of two microseconds.

20. The circuit of claim 17 wherein the scan circuit operates at a frequency of approximately 50 kilocycles.

21. The circuit of claim 17 wherein the retrace means comprises a retrace transistor and wherein the circuit further comprises means for improving the turn off characteristic of the retrace transistor comprising:

an energy storage device connected to the base of the retrace transistor for accumulating energy during the second time interval and for applying a negative pulse to the transistor after termination of the second timing interval.

22. The circuit of claim 17 wherein the second circuit means comprises an electronic current switching device connected to the second timing means; and means for converting the current signal through the electronic current switching device to a voltage signal.

23. The circuit of claim 17 further comprising:

bypass means connected across the sweep means for bypassing excess energy produced during the first time interval; and energy storage means connected to the bypass means for accumulating excess energy produced during the first time interval.

24. The circuit of claim 17 further comprising:

bypass means connected across the retrace means for bypassing excess energy produced during the second time interval; and energy storage means connected to the bypass means for accumulating excess energy produced during the second timing interval.

25. The circuit of claim 17 wherein the cathode ray tube has a first anode connection and wherein the scan circuit further comprises a voltage multiplier for generating a high voltage for the first anode connection of the tube.

26. The circuit of claim 25 wherein the voltage multiplier generates a 1.1 kilovolt acceleration voltage to be supplied to the first anode of the tube.

27. The circuit of claim 17 wherein the cathode ray tube has a brightness grid and wherein the scan circuit further comprises means for generating a voltage to be supplied to the brightness grid of the tube.

28. The circuit of claim 17 wherein the cathode ray tube has a horizontal yoke and wherein the scan circuit is connected to the horizontal yoke to produce a horizontal drive signal with a frequency in excess of 40 kilocycles.

29. The electronic cathode ray tube display circuit of claim 16 further comprising a vertical drive circuit comprising:

receiving means for receiving an input signal;

means for generating a linear ramp signal after the input signal has been received;

solid state shaping means for shaping the linear ramp to compensate for nonlinearities due to the surface of the tube;

summing means connected to the ramp generating means and the shaping means for producing a drive signal compensated for nonlinearities due to the surface of the tube; and output means connected to the yoke to drive the yoke according to the signal produced.

30. The circuit of claim 29 wherein the shaping means comprises a matched pair of transistors and wherein the output signal from the shaping circuit is derived from the characteristic curve of the transistors.

31. The circuit of claim 29 further comprising a zero crossover network.

32. The circuit of claim 29 wherein the cathode ray tube has a focus grid and further comprising a dynamic focus circuit connected to the focus grid of the tube for increasing the voltage supplied to the focus grid when the trace reaches the edge of the tube.

33. The circuit of claim 29 wherein the drive signal produced by the ramp generating means and the shaping means causes a trace scan to occur on the cathode ray tube and further comprising means for causing a retrace scan.

34. The circuit of claim 33 wherein the means for generating a linear ramp signal comprises an energy source and energy storage means for accumulating energy to generate the ramp signal and wherein the receiving means comprises timing means for generating a finite time interval during which the energy accumulated by the energy storage means is dissipated and wherein the same for causing a retrace scan comprises solid state components connected to the summing means and the yoke of the tube for generating a retrace scan signal after the energy has been dissipated from the energy storage means.

35. The electronic cathode ray tube display circuit of claim 16 further comprising:

an energy source;

energy storage means connected to the energy source for accumulating energy to generate a ramp signal;

solid state shaping means for shaping the ramp signal to compensate for nonlinearities due to the surface of the tube;

summing means connected to the ramp generating means and the shaping means for producing a vertical drive signal compensated for nonlinearities due to the surface of the tube;

receiving means for receiving an input sync pulse for vertical retrace comprising timing means to generate a finite time interval during which the energy accumulated by the energy storage means is dissipated; and vertical retrace means connected to the energy storage means for causing a vertical retrace scan to occur after the energy stored in the energy storage means has been dissipated.

36. The circuit of claim 35 wherein the energy storage means accumulates energy to generate the ramp signal after the termination of the finite time interval determined by the timing means.

37. The cathode ray tube display circuit of claims 17 or 29 wherein the cathode ray tube has a brightness grid and the display circuit produces an output signal to the brightness grid and further comprising protection circuitry for cutting off the output signal to the brightness grid when loss of a signal is detected.

* * * * *

UNITED STATES PATENT AND TRADEMARK OFFICE
CERTIFICATE OF CORRECTION

PATENT NO. : 4,238,774
DATED : December 9, 1980
INVENTOR(S) : Frederick D. Lehman It is certified that error appears in the above—identified patent and that said Letters Patent is hereby corrected as shown below:

In Claim 34, column 14, line 24, "same" should read "means".

Signed and Sealed this

Thirty-first Day of March 1981

[SEAL]

Attest:

RENE D. TEGTMEYER

Attesting Officer     Acting Commissioner of Patents and Trademarks